United States Patent [19]

Amin et al.

[11] Patent Number: 5,455,793

[45] Date of Patent: Oct. 3, 1995

[54] ELECTRICALLY REPROGRAMMABLE EPROM CELL WITH MERGED TRANSISTOR AND OPTIMUM AREA

[75] Inventors: Alaaeldin A. M. Amin, Dhahran, Saudi Arabia; James Brennan, Jr., Saratoga, Calif.

[73] Assignee: National Semiconductor Corp., Santa Clara, Calif.

[21] Appl. No.: 340,810

[22] Filed: Nov. 17, 1994

Related U.S. Application Data

[60] Continuation of Ser. No. 144,817, Oct. 28, 1993, abandoned, which is a division of Ser. No. 821,165, Jan. 15, 1992, Pat. No. 5,293,328.

[51] Int. Cl.$^6$ ............................................... G11C 11/34
[52] U.S. Cl. ................... 365/185.26; 257/315; 257/316; 257/320
[58] Field of Search ............................ 365/185, 218; 257/315, 316, 317, 319, 320

[56] References Cited

U.S. PATENT DOCUMENTS

| | | | |
|---|---|---|---|
| 4,099,196 | 7/1978 | Simko | 365/185 |
| 4,336,603 | 6/1982 | Kotecha | 365/185 |
| 4,999,812 | 3/1991 | Amin | 365/185 |
| 5,057,886 | 10/1991 | Riemenschneider | 365/185 |
| 5,091,882 | 2/1992 | Naruke | 365/185 |
| 5,101,250 | 3/1992 | Arima et al. | 365/185 |
| 5,111,430 | 5/1992 | Morie | 365/185 |
| 5,235,544 | 8/1993 | Caywood | 365/218 |
| 5,268,318 | 12/1993 | Harari | 257/320 |

FOREIGN PATENT DOCUMENTS 3520636  5/1977  Japan .

OTHER PUBLICATIONS

S. Mukherjee et al., A Single Transistor EEPROM Cell and Its Implementation in a 512K CMOS EEPROM, Int. Electron Devices Meeting, Paper 26.1, pp. 616–619.

H. Kume et al., A Flash–Erase EEPROM Cell with an Asymmetric Source and Drain Structure, Int. Electron Dev. Meeting, Paper 25.8, pp. 560–563.

G. Samachisa et al., A 128K Flash EEPROM Using Double Polysilicon Technology, 1987 IEEE International Solid–State Circuits Conf., Paper 7.4, pp. 76–77.

F. Masuoka et al., A New Flash E$^2$ PROM Cell Using Crippled Polysilicon Technology, 1985, IEEE International Solid–State Circuits Conf., pp. 168–169.

F. Masuoka et al, A 256K Flash EEPROM Using Triple Polysilicon Technology, 1985 IEEE International Solid–State Circuits Conf., pp. 168–169.

V. N. Kynett et al., An In–System Reprogrammable 256K CMOS Flash Memory, 1988 IEEE International Solid–State Circuits Conf., pp. 132–133.

*Primary Examiner*—David C. Nelms
*Assistant Examiner*—Son Dinh
*Attorney, Agent, or Firm*—Steven F. Caserza; Flehr Hohbach Test Albritton & Herbert

[57] ABSTRACT

A novel nonvolatile memory cell structure is provided using a non-self aligned CMOS process with two independent N+ implants using a two or a three polysilicon layer technology that allows in-circuit electrical erase and reprogramming together with reduction in cell size requirement. The novel memory cell is implemented with a merged transistor structure having an access transistor and a programmable transistor. The memory cell is constructed by having the control gate, formed of a first polysilicon layer, covering a portion of the channel length between drain and source to form the access portion of the merged transistors, and a floating gate formed of a second polysilicon layer overlapping a second portion of the channel length to form the programmable transistor portion of the merged transistor. Such merged transistor structure is equivalent to two transistors in series, a programmable transistor in series with an access transistor. A memory cell structure described in accordance with this invention allows a reduction of the portion of the floating gate covering the programmable transistor portion of the channel length. This results in a reduction in the floating gate to substrate capacitance ($C_{FB}$) thereby improving the programming coupling ratio and reducing the overall cell size.

10 Claims, 5 Drawing Sheets

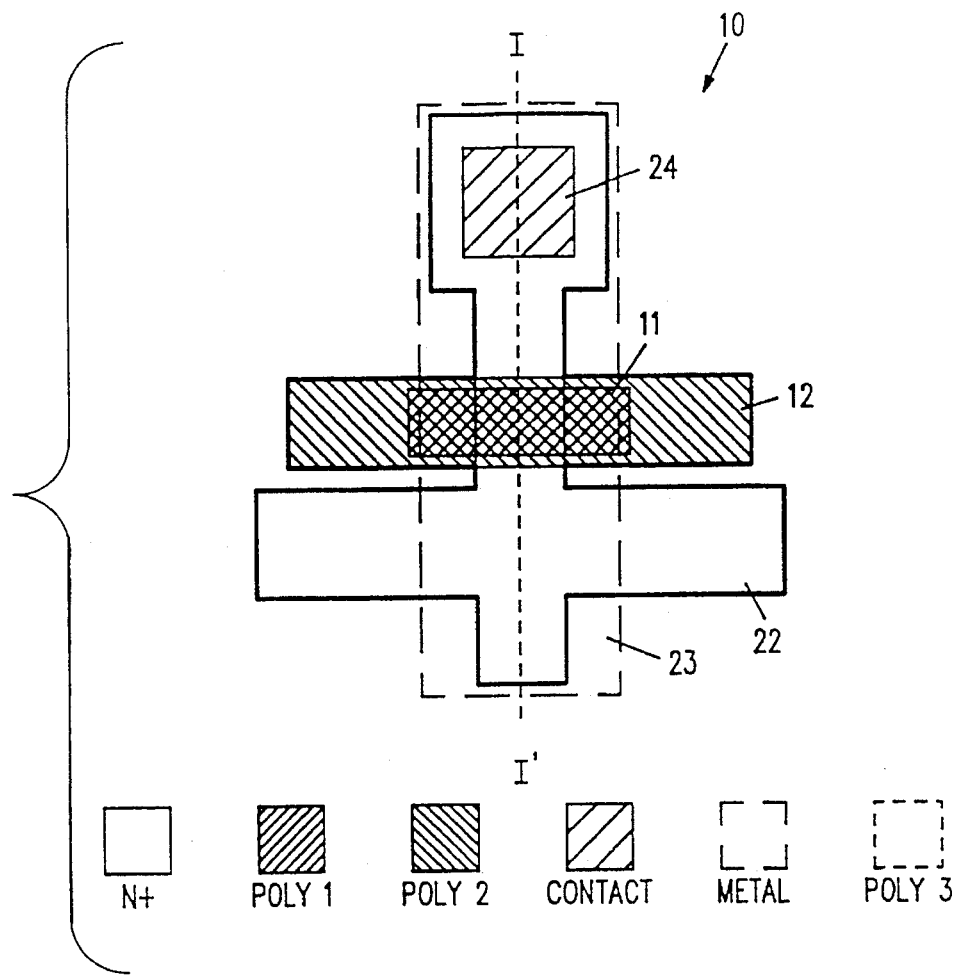
FIG. 1a
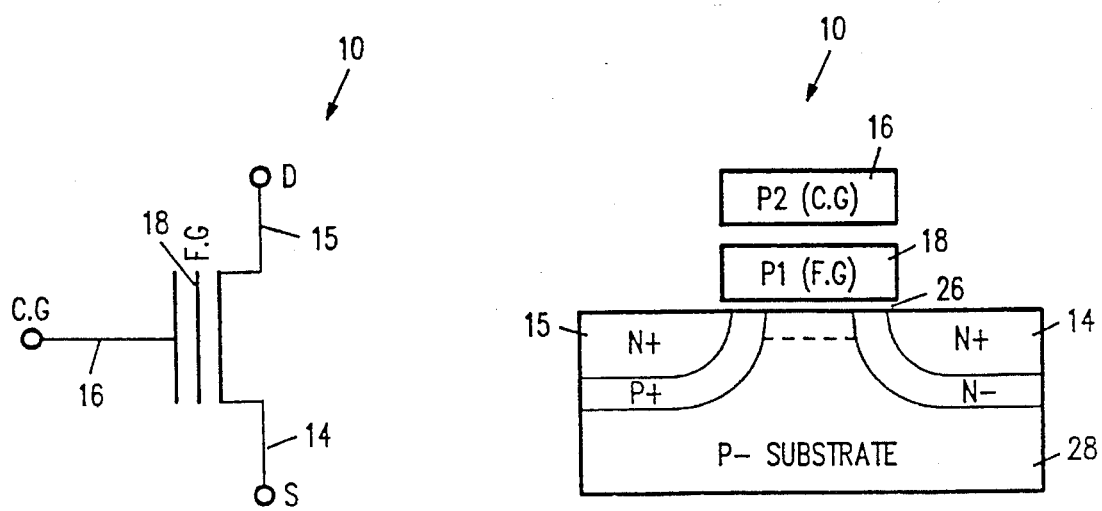
FIG. 1b
FIG. 1c

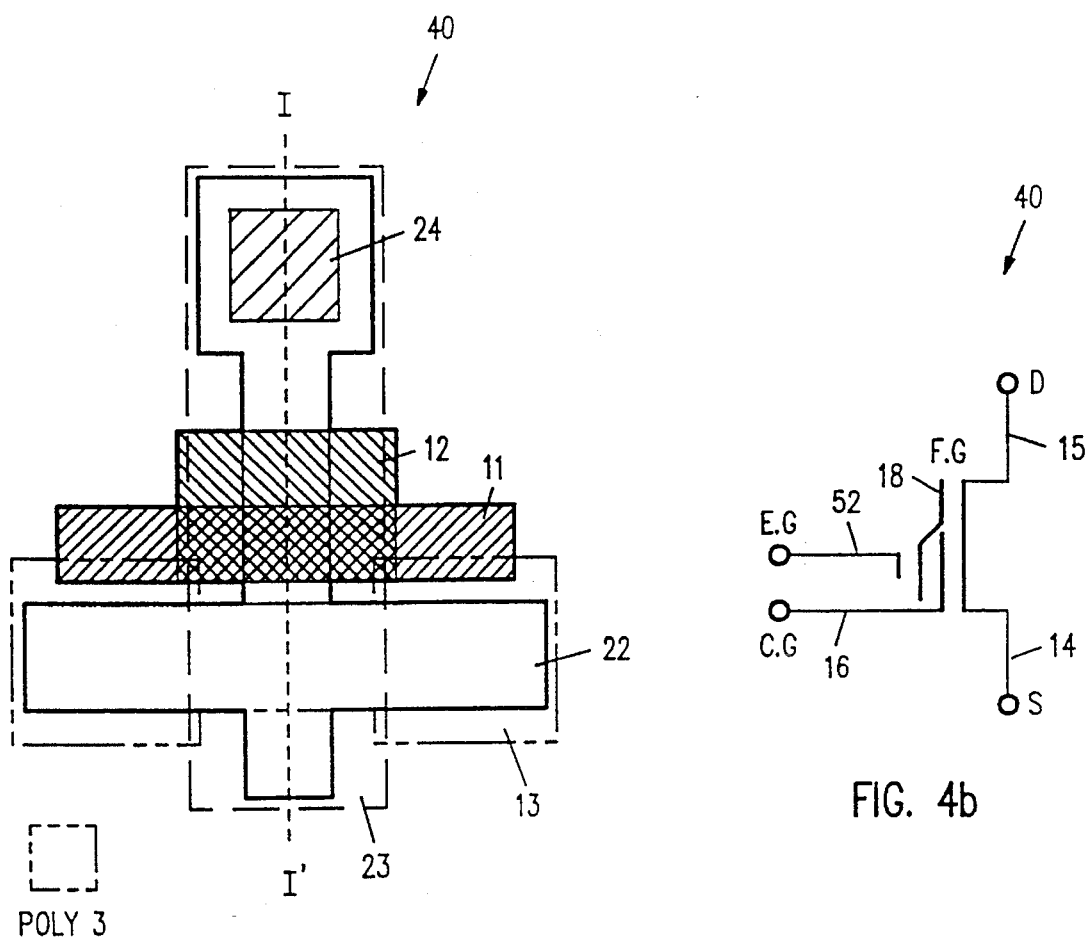
FIG. 4a
FIG. 4b
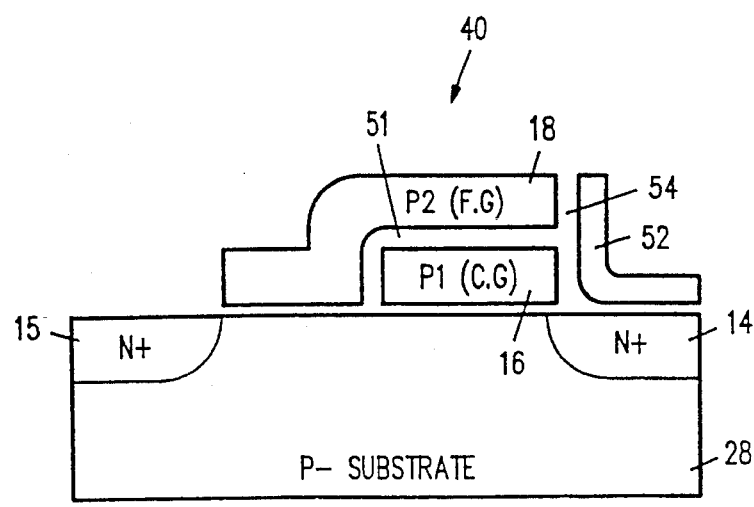
FIG. 4c

ELECTRICALLY REPROGRAMMABLE EPROM CELL WITH MERGED TRANSISTOR AND OPTIMUM AREA

CROSS REFERENCE TO RELATED APPLICATIONS

This application is a continuation of U.S. application Ser. No. 08/144,817, filed Oct. 28, 1993 now abandoned, which in turn is a divisional of application Ser. No. 07/821,165, filed Jan. 15, 1992, now U.S. Pat. No. 5,293,328.

FIELD OF THE INVENTION

This invention relates to nonvolatile electrically erasable and reprogrammable memory devices.

BACKGROUND

The spectrum of nonvolatile memories available today includes the mask programmed ROM, the fusible link bipolar PROMs, the one time programmable (OTP) ROMs, the ultra-violet erasable EPROMs (UV-EPROMs), and the electrically erasable PROMs (EEPROMs). Mask programmed ROMs are the earliest and least flexible type: once programmed, the stored information cannot be altered. UV-EPROMs offer more flexibility, information stored can be erased using ultra violet (UV) light and then electrically reprogrammed into a new pattern. With a single transistor per memory cell UV-EPROM memory arrays allow very high packing densities and low cost per bit. However, even though UV-EPROMs offer firmware designers more flexibility than the mask programmed ROMs, PROMs and the OTP ROMs, it is still not flexible enough for their needs. For a stored program to be updated, the UV-EPROM has to be taken out of its board and either replaced with another UV-EPROM having the new program or erased by putting it in special UV ovens for 10–20 minutes and then programmed with the new code using special purpose hardware programmers.

While EEPROM memories achieve greater flexibility allowing in-circuit electrical erase and reprogramming, their high cost and small densities have limited their use. The high cost of EEPROM memories is not only due to their complex process but is also due to the fact that the EEPROM memory cell size is three to four times the size of a UV-EPROM cell for the same technology. The high cost per bit has limited the use of EEPROM chip mostly to applications where the user is expected to customize the system environment according to his needs or where the system configuration needs frequent updates.

The flash erase EEPROM (FEEPROM) is the latest addition to the nonvolatile ROM family members. FEEPROM is meant to bridge the gap between existing UV-EPROM and EEPROM by offering the type of ROM which is both electrically erasable as EEPROM and has the high density and cost efficiency of UV-EPROM. In addition to being electrically erasable, erasure of FEEPROM arrays take only few seconds as compared to erase times of 10–20 minutes for UV-EPROM arrays. This provides FEEPROMs with in-circuit program and erase capabilities.

Several FEEPROM memory cell structures have been described in, for example, S. Mukherjee, et al., "A Single Transistor EEPROM Cell And Its Implementation In A 512K CMOS EEPROM," *IEDM*, paper 26.1, pp. 616–619 (1985); H. Kume, et al., "A Flash-Erase EEPROM Cell With An Asymmetric Source And Drain Structure," *IDEM*, paper 25.8, pp. 560–563 (1987); G. Samachisa, et al., "A 128K Flash EEPROM Using Double Polysilicon Technology," *ISSC*, paper 7.4, pp. 76–77 (1987); F. Masouka, et al., "A New Flash $E^2$prom Cell Using Triple Polysilicon Technology," *IDEM,* paper 17.3, pp. 464–466 (1984).

Typically, a FEEPROM memory cell transistor is considered programmed when it is in the high threshold voltage state, i.e. when its floating gate is negatively charged with trapped injected electrons. FEEPROM memory cell is typically assumed to store a logic "0" when in the programmed state. Similar to UV-EPROM, FEEPROM is programmed by injecting hot electrons into the floating gate of the memory cell. A FEEPROM memory cell is considered erased when it is in the low threshold voltage state, i.e. when its floating gate is depleted from trapped injected electrons. FEEPROM memory cell typically is assumed to store a logic "1" when in the erased state. Erasure is normally achieved via electron tunneling from the floating gate to either an erase electrode as described in Masouka, or to one of the cell junctions as described in Mukherjee, Kume, and Samachisa.

Prior art FEEPROM memory cells are shown in FIGS. 1a–1c and 2a–2c. Typically, the prior art FEEPROM memory cells are programmed by applying a voltage ($V_{CG}$) on control gate 16, typically of about 12V–14V, and a voltage (VD) on drain 15, typically of about 7.5V–10V, while grounding source 14, ($V_S$=0V).

FIGS. 1a–1c show an example of a prior art single transistor memory cell 10 in terms of its topographical layout (FIG. 1a), schematic representation (FIG. 1b) and its cross-sectional view (FIG. 1c). When floating gate 18 is electrically neutral or slightly positively charged, memory cell 10 is in the 'erased' state, and memory cell 10 has a low threshold voltage (Vte) typically of about 1.5 volts. When floating gate 18 is negatively charged, transistor 10 is programmed, and it has a high threshold voltage (Vtp), typically of about 6.5 volts.

Memory cell 10 is "programmed" by applying a high voltage of about 12v–14v to control gate 16 and a high voltage of about 8v–10v to drain 15, while grounding source 14. Good capacitive coupling between control gate 16 and floating gate 18 improves the vertical electric field formed between substrate 28 and floating gate 18 to improve the programming efficiency of memory cell 10. The floating gate voltage ($V_F$) can be expressed by:

$$V_F = \frac{(V_G * C_{FG}) + (V_D * C_{FD}) + Q_F}{C_{FG} + C_{FS} + C_{FD} + C_{FB}} \text{ ; where} \tag{1}$$

$V_F$=Floating gate voltage;

$V_G$=Control gate voltage;

$V_D$=Drain voltage;

$Q_F$= Net charge stored on the floating gate;

$C_{FG}$=Floating gate to control gate capacitance;

$C_{FD}$=Floating gate to drain capacitance;

$C_{FS}$=Floating gate to source capacitance; and $C_{FB}$=Floating gate to substrate capacitance.

The voltage coupled to the floating gate from the control gate ($V_F$) is controlled by the following ratio, also referred to as the programming coupling ratio, $$\frac{C_{FG}}{C_{TOT}} \text{ ; where} \tag{2}$$

$$C_{TOT} = C_{FG} + C_{FS} + C_{FD} + C_{FB} \text{; and} \tag{3}$$

$C_{TOT}$ =Floating gate total capacitance.

Increasing the programming coupling ratio as expressed in equation (2) increases the efficiency of the floating gate to collect hot electrons and, thus, also increases the programming efficiency of the FEEPROM memory cell. The programming coupling ratio can be increased either by decreasing the floating gate to substrate capacitance ($C_{FB}$) or by increasing the floating gate to control gate ($C_{FG}$) capacitance. One way to increase this ratio without increasing the memory cell size is by increasing $C_{FG}$ through the use of special dielectrics of high dielectric constant between floating gate 18 and control gate 16 such as with an oxide nitride oxide (ONO) sandwich which has generally been used in more recent EPROM cells.

The programming efficiency can also be enhanced through enhancing the efficiency of hot electron generation. This can be achieved by having a higher electric field at drain injunction 11 where hot electrons are generated. Enhancement of hot electron generation is accomplished by using a shallower drain junction as well as using P+ type implant surrounding the drain junction.

Typically, memory cell 10 is "erased" by electron tunneling from floating gate 18 to source 14. This is accomplished by electrically grounding, relative to source 14, control gate 16 while a high voltage pulse of about 14v–17v is applied to source 14. Drain junction 15 is left to float to avoid punch through problems between source 14 and drain 15. Electron tunneling is appreciable at relatively high electric fields between 7 Mv/cm to 10 Mv/cm.

To achieve such high electric fields, the thickness of the first gate oxide 26 between floating gate 18 and substrate 28 is reduced to prevent the need to use excessive voltages on chip. However, thinning gate oxide results in processing and reliability problems, and it also reduces the programming coupling ratio causing degradation in programming efficiency. Improving the programming coupling ratio of memory cell 10 necessitates increasing the cell size when the thickness of the first gate oxide is reduced: since the programming coupling ratio is decreased, the cell area must be increased to improve the programming coupling ratio. Improving the programming coupling ratio of memory cell 10 necessitates increasing the cell size. Thus, source 14 of memory cell 10 must withstand a high erase voltage (re) without breakdown. Lowering the erase voltage by decreasing the thickness of first gate oxide 26 is also not a solution since the gated diode breakdown voltage is reduced for thinner gate oxides. To increase the gated diode breakdown of the source junction, a deeper doubly diffused N+–N− junction is used.

The floating gate voltage during erase is given by:

$$V_F = \frac{V_e * C_{FS} + Q_F}{C_{TOT}} \quad ; \text{where} \quad (4)$$

$V_e$=The erase voltage.

For more efficient erasure, $V_F$, floating gate voltage should be minimized and, thus, the erase coupling ratio, expressed as $$\frac{C_{FS}}{C_{TOT}} \quad (5)$$

should be minimized.

Ideally, it is preferable to have FEEPROM arrays with one transistor per memory cell, a structure similar to UV-EPROMs. However, contrary to the self limiting nature of erasure by UV radiation, electrical erase is not self limiting. FEEPROM memory cell may become partially erased, where only part of the stored electron charge has been removed, or over-erased where the floating gate may become positively charged, depending on the applied erase voltage and applied erase time. An over-erased FEEPROM memory cell threshold voltage may result in a negative threshold voltage causing the over-erased FEEPROM cell to become a depletion transistor memory cell.

Prior art FEEPROM cell structures approached the over-erase problem by using a merged transistor memory cell structure with a single control gate covering the full length of the channel between the drain and source, and a floating gate only covering part of the channel length. Such merged transistor structure is equivalent to two transistors in series, a programmable transistor and an access transistor, but without a separation of the transistors by a physical junction. The programmable transistor controls the programming of the memory cell, while the access transistor limits the current and prevents an incorrect reading of the stored data if the programmable transistor is over-erased into depletion mode. In typical prior art merged transistor FEEPROMs, the part of the channel covered by the floating gate acts as the programmable transistor while the part of the channel covered only by the control gate acts as the access transistor. Such a structure avoids over-erase problems, while reducing the cell size, when compared to conventional merged transistor type EEPROMs.

Shown in FIGS. 2a–2c is a prior art merged transistor FEEPROM memory cell 20. Similar to the prior art EEPROM cells, merged transistor memory cell 20 operates in effect as two transistors in series, an access transistor and a programmable transistor. The access transistor is controlled via access portion ($L_a$) 17 of control gate 16, while the programmable transistor is controlled via portion ($L_p$) 19 of floating gate 18. The access transistor alleviates over-erase problems by preventing current flow through unselected memory cells of an array of memory cells. Merged transistor FEEPROM memory cell 20 not only provides two series transistors, but it is smaller in cell size than the typical two transistor per cell EEPROM, since memory cell 20 eliminates the physical junction normally separating the two series transistors.

When programmed, the effective threshold voltage of memory cell 20 equals the threshold voltage of the programmable transistor. Even if the programmable transistor is erased into depletion, the overall effective threshold voltage of memory cell 20 will remain positive, limited by the threshold voltage of the access transistor. Thus the effective overall threshold voltage is limited to the higher of either the programmable transistor or the access transistor. To program, floating gate 18 is charged with excess electrons which increases the threshold voltage of programmable transistor region 19 of memory cell 20. With floating gate 18 of memory cell 20 overlapping only drain junction 15, the electrical erase of memory cell 20 is also performed at drain junction 15. Effectively, both programming and erasing of memory cell 20 are thus performed at drain junction 15.

The programming conditions of memory cell 20 are similar to those of memory cell 10. However, programming for cell 20 is inherently less efficient since the lateral electric field is reduced due to the voltage drop across the access transistor. This voltage drop can be compensated by increasing the drain voltage during the programming mode of memory cell 20. However, increasing the drain voltage risks erasure of unselected memory cells of the same column in an array erase.

The erase conditions of memory cell 20 are similar to those of memory cell 10 with the exception that the erase pulse is to be applied to drain junction 15, while source junction 14 is floated.

For memory cell 20, both programming and erasure are performed at the drain junction, which imposes conflicting requirements on the drain junction. Shallow drain with P+ background implant is preferable for improved programming performance, while deeper drain junctions with preferably N− background implant is preferable for better erase performance. Optimizing the drain junction profile for these conflicting requirements typically compromises memory cell performance.

The conditions for the different operating modes of cells 10 and 20 are summarized as shown in Table 1.

TABLE 1

| | | FEEPROM Operating Modes | | |
|---|---|---|---|---|
| | | PROGRAM | ERASE | READ |
| Cell 10 | $V_{CG}$ | −14 V | 0 C | −4.5 V |
| | $V_D$ | 7–9 V | float | −1.75 V |
| | $V_S$ | 0 V | $V_e$ | 0 V |
| Cell 20 | $V_{CG}$ | 14 V | 0 V | −4.5 V |
| | $V_D$ | 8–10 V | $V_e$ | −1.75 V |
| | $V_S$ | 0 V | float | 0 V |

Thus, the prior art FEEPROM memory cell structures can be generally classified into single transistor memory cell structure and merged transistor cell structure. In both types of prior art embodiments of FEEPROM memory cell structures, first polysilicon layer (poly1) 11 deposited over substrate 28 between drain 15 and source 14 forms floating gate 18 of memory cells 10 and 20, while second polysilicon layer (poly2) 12 deposited over floating gate 18 forms control gate 16.

Single transistor FEEPROM memory cell structures, such as those described in S. Mukherjee, et al., and Kume, et al., suffer from over-erase problems causing this type of FEEPROM memory cells to result in unreliable erase and programming performance. Single transistor FEEPROM memory cells exhibit over-erase problems at all junction profiles. Even at low erase currents, these cells may erase to voltages below their threshold values if erase time is sufficiently long. The threshold voltage of single transistor FEEPROM memory cell may even become negative changing the memory cell into a depletion device. In a full array erase, these changes in memory cell erase threshold value may result in an unreliable erase of the memory cells due to some memory cells becoming depletion devices. Single transistor FEEPROM memory cells therefore require a strict control of both the erase current and erase time to be exercised. However, even under such conditions, the array erase reliability cannot be guaranteed.

Prior art merged transistor FEEPROM memory cell structure with two polysilicon layer technology as described in Samachisa, et al., avoids the over-erase problem by using an integral select transistor in the part of the memory cell. This approach allows both programming and erasure to be accomplished at the drain junction of the merged transistor. However, this approach requires tight process control to optimize both the erase and programming requirements at the drain junction.

Another embodiment of a prior art merged transistor FEEPROM memory cell structure as described in Masouka, et al., incorporates a triple polysilicon layer technique, where a first polysilicon layer is used as an erase electrode, a second polysilicon layer is used as a floating gate, and a third polysilicon layer formed over the floating gate acts as the control gate of the merged transistor. This approach is disadvantageous since the floating gate is spaced away from the drain junction, requiring higher programming voltages, greater power consumption, and resulting in unreliable programming operation. This type of structure also requires excessively high voltages for both programming and erasure which limits the practicality and manufacturability of this structure.

There is therefore a need for improved FEEPROM memory cells which provides an improvement to memory cell programming and erasure performance, without increasing FEEPROM programming voltage or cell size.

SUMMARY OF THE INVENTION

In accordance with the teachings of this invention, a novel nonvolatile memory cell structure is provided using a non-self aligned CMOS process with two independent N+ implants using a two or a three polysilicon layer technology that allows in-circuit electrical erase and reprogramming together with reduction in cell size requirement. The novel memory cell is implemented with a merged transistor structure having an access transistor and a programmable transistor. The merged transistor is constructed by having first polysilicon layer (poly1) 11 covering access portion 17 of the channel length to form control gate 16 of the access transistor, and second polysilicon layer (poly2) 12 overlapping programmable portion 19 of the channel length and control gate 16 to form floating gate 18, forming the gate of the programmable transistor. Such merged transistor structure is equivalent to two transistors in series, a programmable transistor in series with an access transistor.

A memory cell structure described in accordance with this invention allows a reduction of the portion of the floating gate covering the programmable transistor portion of the channel length. This results in a reduction in the floating gate to substrate capacitance ($C_{FB}$) thereby improving the programming coupling ratio and reducing the overall cell size. The programming efficiency is also improved due to increased coupling between the drain and the floating gate through the added capacitance between the floating gate and the metal bit 23 (which is connected to the drain).

BRIEF DESCRIPTION OF THE DRAWINGS

FIG. 1a is a topographical view of the layout of a prior art single transistor memory cell structure;

FIG. 1b is a schematic circuit representation of the prior art single transistor memory cell of FIG. 1a;

FIG. 1c is a cross-sectional view along I—I' of the single transistor memory cell structure of FIG. 1a;

FIG. 2b is a schematic circuit representation of the prior art merged transistor memory cell of FIG. 2a;

FIG. 2c is a cross-sectional view along I—I' of the merged transistor memory cell structure of FIG. 2a;

FIG. 3b is a schematic circuit representation of the merged transistor memory cell of FIG. 3a;

FIG. 3c is a cross-sectional view along I—I' of the merged transistor memory cell structure of FIG. 3a;

FIG. 4a is a topographical view of the layout of an alternative embodiment of a merged transistor memory cell structure in accordance with the teachings of this invention;

FIG. 4b is a schematic circuit representation of the merged transistor memory cell of FIG. 4a;

FIG. 4c is a cross-sectional view along I—I' of the merged transistor memory cell structure of FIG. 4a;

FIG. 5b is a schematic circuit representation of the merged transistor memory cell of FIG. 5a; and FIG. 5c is a cross-sectional view along I—I' of the merged transistor memory cell structure of FIG. 5a.

DESCRIPTION OF SPECIFIC EMBODIMENTS

Figure 2A:
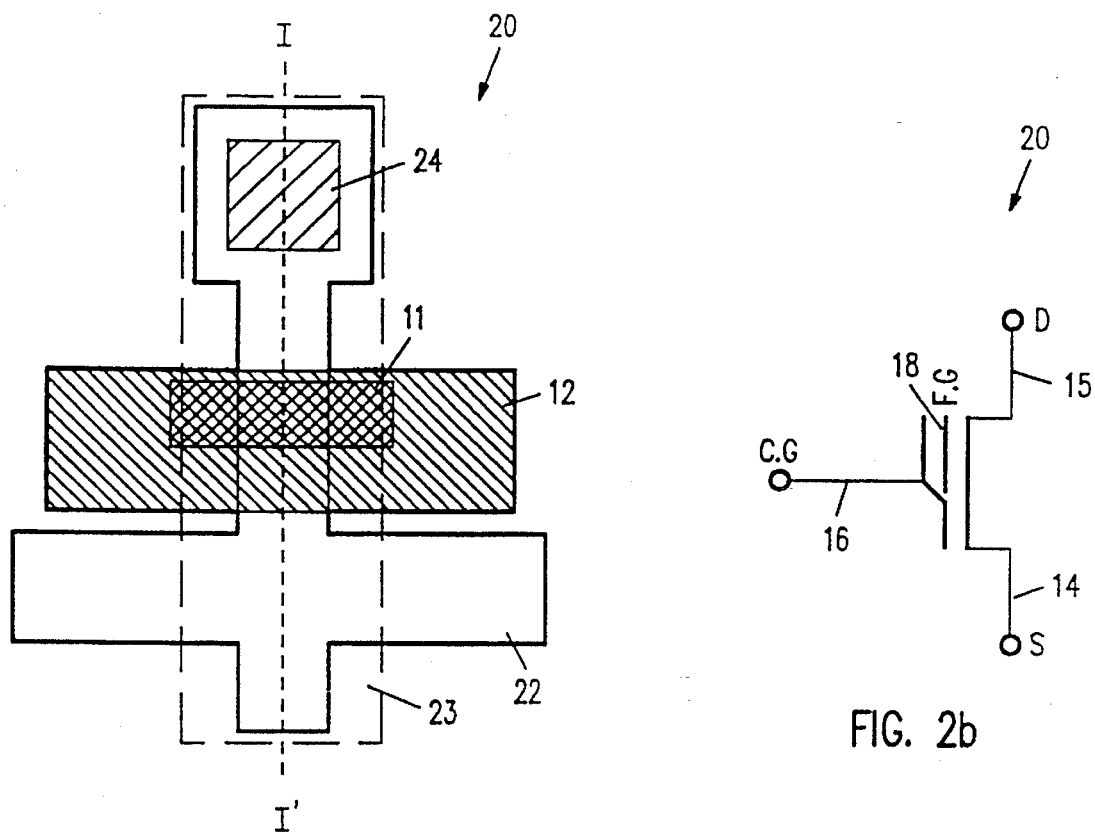
FIG. 2a is a topographical view of the layout of a prior art merged transistor memory cell structure.
Figure 2B:
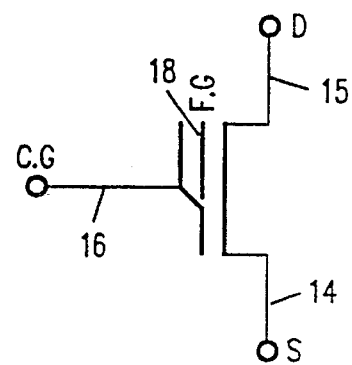
Figure 2C:
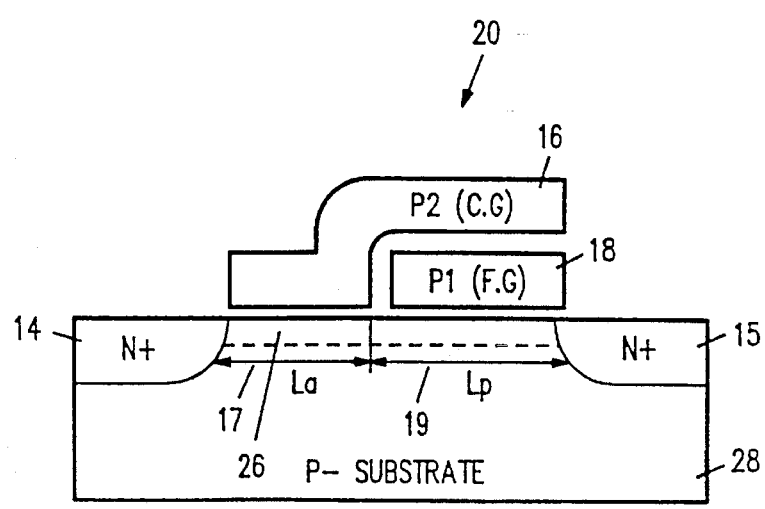
Figure 3A:
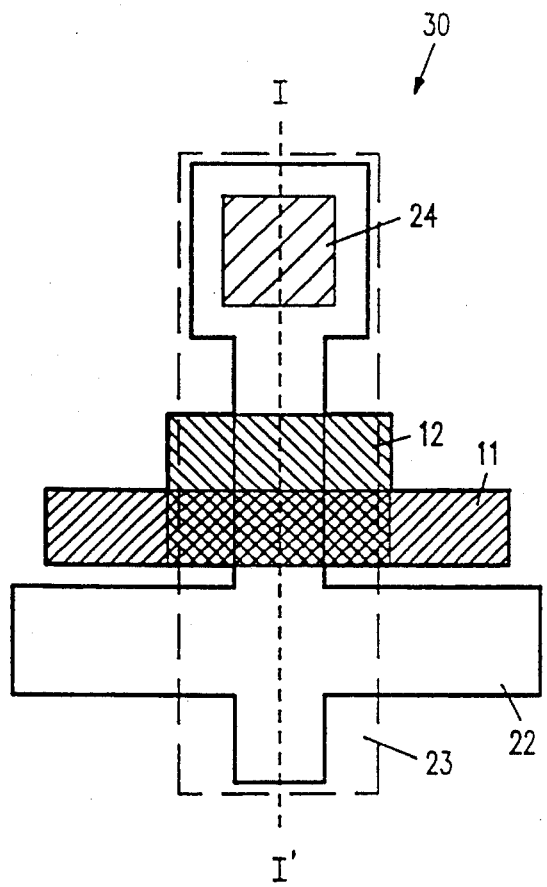
FIG. 3a is a topographical view of the layout of a merged transistor memory cell structure in accordance with the teachings of this invention.
Figure 3B:
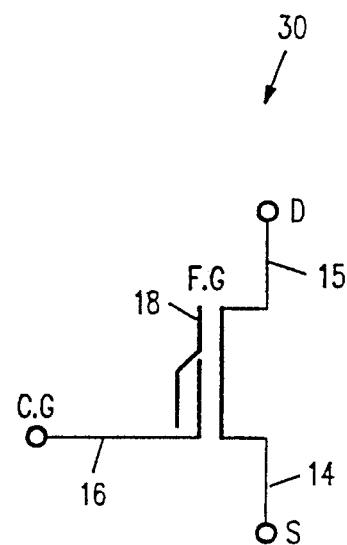
Figure 3C:
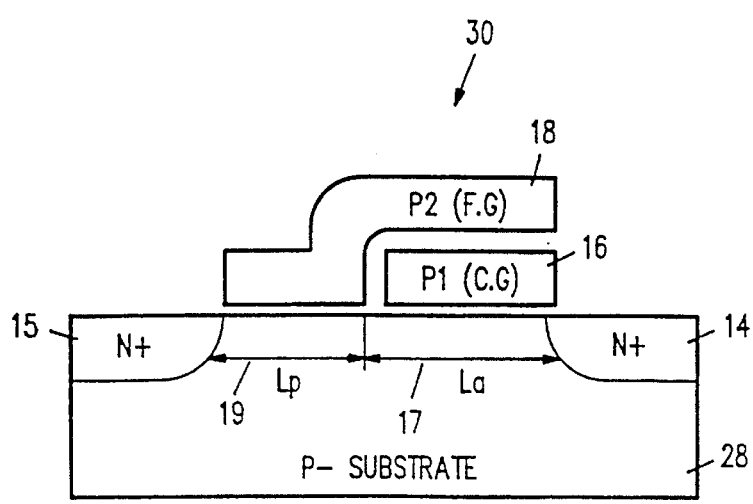

FIGS. 3a–3c depict one embodiment of a merged transistor FEEPROM memory cell 30 constructed in accordance with the principles of this invention. Contrary to the construction of prior art memory cells 10 and 20 shown in FIGS. 1a–1c and 2a–2c, first polysilicon layer 11 forms control gate 16, while second polysilicon layer 12 forms floating gate 18. Floating gate 18 of memory cell 30 shown in FIG. 3c overlaps only drain junction 15. The overlap between metal bit line 23 and floating gate 18 formed by second polysilicon layer 12 provides an added capacitance term to $C_{FD}$ which improves programming efficiency of cell 30 as compared to the prior art cell 20 of FIG. 2. Such an added capacitance term is not possible in prior art cell 20, since in that prior art cell the second polysilicon layer forms the control gate which shields the floating gate from the metal bit line connected to the drain. Thus, during programming $$V_F = \frac{(V_G * C_{FG}) + (V_D * C_{FD}) + Q_F}{C_{TOT}} \text{ ; where}$$

$C_{FD}$ is higher in the cell 30 structure since the drain metal 23 is now capacitively coupled to the floating gate (in cell 20 the metal line is not coupled to the floating gate since it is made of Poly 1).

The method described in accordance with the principles of this invention to construct memory cell 30 facilitates a reduction of the portion of floating gate 18 covering the programmable transistor channel length ($L_p$) 19 to effectively reduce the floating gate to substrate ($C_{FB}$) capacitance. Reducing the programmable transistor channel length ($L_p$) 19 not only improves the programming coupling ratio, but it also reduces the overall cell size of memory cell 30.

The programming coupling ratio is enhanced over the prior art by this construction in two ways. Firstly, capacitive coupling is improved because metal bit line 23 capacitively couples the drain voltage $V_D$, of about 8V–10V, to floating gate 18 of second polysilicon 12 located beneath metal bit line 23. Secondly, by forming floating gate 18 over control gate 16, it is easier to resolve the geometry of floating gate 18 in the construction of memory cell 30, compared to the prior art memory cell structures of 10 and 20 shown in FIGS. 1a–1c and 2a–2c. In this configuration, the overlap of floating gate 18 over substrate 28 is reduced and, subsequently, $C_{FB}$ is also reduced.

The conditions for the different operating modes of memory cell 30 are shown in Table 2.

TABLE 2

| | | FEEPROM Operating Modes | | |
| --- | --- | --- | --- | --- |
| | | PROGRAM | ERASE | READ |
| Cell 30 | $V_{CG}$ | 14 V | 0 | –4.5 V |

TABLE 2-continued

| | | FEEPROM Operating Modes | | |
| --- | --- | --- | --- | --- |
| | | PROGRAM | ERASE | READ |
| | $V_D$ | 8–10 V | $V_e$ | –1.75 V |
| | $V_S$ | 0 | float | 0 |

FIGS. 4a–4c and 5a–5c illustrate some of the alternative embodiments envisioned as also being within the scope of this invention. Memory cell 40 is similar to memory cell 30 with the exception that third polysilicon layer 13 is provided to form erase electrode 52. This avoids the problem in optimizing drain junction 15 as encountered in prior art merged memory cell 20 (FIG. 2c) to accommodate the conflicting requirements of both programming and erasing at the drain junction. Erase electrode 52 formed of the third polycrystalline silicon layer 13 is formed over source junction 14 and overlaps floating gate 18 and a portion of control gate 11. However, the overlap of erase electrode 52 over floating gate 18 should be minimized to achieve a better erase coupling ratio.

As shown in FIGS. 4a–4c, in the formation of memory cell 40, second oxide layer (second interpoly oxide) 54, located between floating gate 18 (poly2) and erase electrode 52 (poly3), is preferably grown at an oxidation temperature lower than the temperature used to grow first oxide layer (first interpoly oxide) 51 located between control gate 16 (poly1) and floating gate 18 (poly2). With a lower oxidation temperature, the top surface of second polysilicon 12 becomes texturized and polysilicon asperities are formed. Such asperities cause locally enhanced oxide electric fields under erase conditions.

Enhanced oxide electric field leads to a lowering of $\phi_\beta$ and thus enhancing the Fowler Nordheim tunneling current given by:

$$J = .84 \times 10^6 (E^2/\phi\beta) \exp\{(-.3/E)\phi\beta^{3/2}\}; \text{ where} \qquad (6)$$

E=The oxide electric field near the injecting point in megavolts per centimeter; and $\phi_\beta$=The electron potential barrier height in electron volts. Lowering the electron potential barrier allows the use of thicker interpoly oxides (600–800) and reduces the erase voltages (~12 volts) required for erasing the memory cell. Lowering the erase voltage will also relax other process parameters requirements, e.g., field threshold and gated diode breakdown voltages. Thus, having a thicker interpoly oxide between second and third polysilicon layers 12 and 13 improves the erase and the programming coupling ratios.

Programming is performed by grounding source 14, applying high voltage (12v–14v) to control gate 16 and a high voltage (8v–10v) to drain 15. Erasure is performed by grounding control gate 16, drain 15, and source 14, while applying an erase voltage Ve, such as, for example, between 12v–15v to erase electrode 52. The conditions for the different operating modes of memory cell 40 are summarized in Table 3.

TABLE 3

| | | FEEPROM Operating Modes | | |
| --- | --- | --- | --- | --- |
| | | PROGRAM | ERASE | READ |
| Cell 40 | $V_{CG}$ | –14 V | 0 V | –4.5 V |

TABLE 3-continued

| FEEPROM Operating Modes | | | |
| --- | --- | --- | --- |
| | PROGRAM | ERASE | READ |
| $V_D$ | 8–10 V | 0 V | ~1.75 V |
| $V_S$ | 0 V | 0 V | 0 V |
| $V_E$ | 0 V | $V_e$(12 V) | 0 V |

Figure 5A:
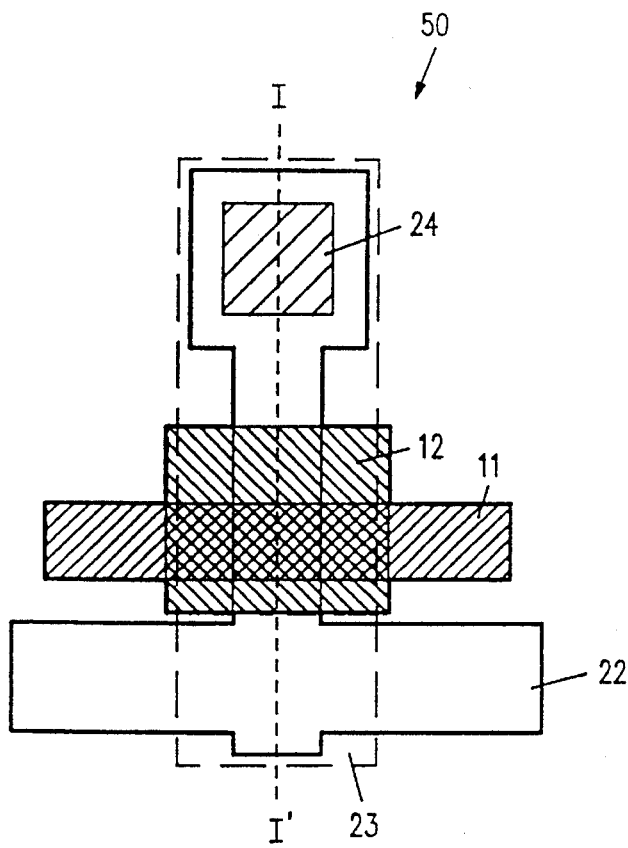
FIG. 5a is a topographical view of a layout of an alternative embodiment of a merged transistor memory cell structure in accordance with the teachings of this invention.
Figure 5B:
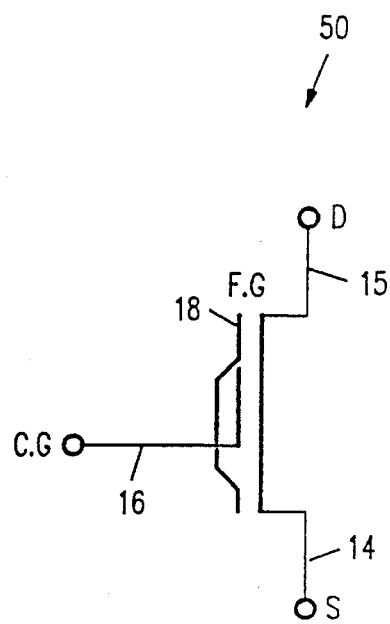
Figure 5C:
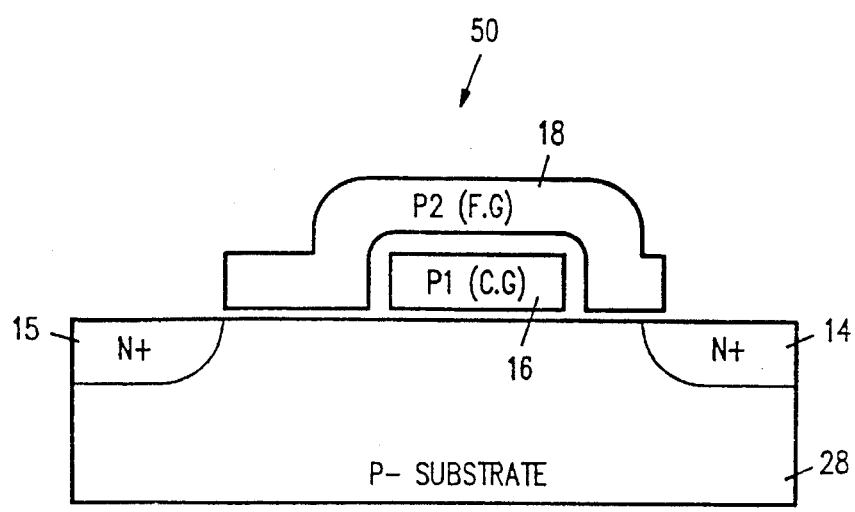

FIGS. 5a–5c depict the layout, the schematic representation, and the cross-section of another alternative embodiment of a merged transistor FEEPROM memory cell. Memory cell 50 operates similarly to memory cell 40, except that only two polysilicon layers (poly1 and poly2) are implemented, with second polysilicon layer 12 forming floating gate 18, overlapping the channel at both drain junction 15 and at source junction 14 (FIG. 5c). Source junction 14 also serves as an erase electrode in this configuration, which permits independent optimization of drain junction 15 and source junction 14 to satisfy the conflicting requirements of the program and erase operations of memory cell 50.

Memory cell 50 has a simpler fabrication process than memory cell 40, since third polysilicon layer 13 is not implemented. However, memory cell 40 has the advantage of having a smaller cell size than memory cell 50.

Unlike prior art FEEPROMs, separating the control of erase and programming operation, ie. with the programming control of memory cell 50 at drain 15 and the erase control at source 14 (FIG. 5c), provides better optimization of the memory cell erase and programming operation. Programming conditions of memory cell 50 are similar to those of memory cell 30 previously described. Erasure is performed by grounding the control gate 16 and floating drain 15, while applying erase voltage Ve, of about 14v–17v to source 14. The conditions for the different operating modes of memory cell 50 are summarized in Table 4.

TABLE 4

| FEEPROM Operating Modes | | | | |
| --- | --- | --- | --- | --- |
| | | PROGRAM | ERASE | READ |
| Cell 50 | $V_{CG}$ | ~14 V | 0 V | ~4.5 V |
| | $V_D$ | 8–10 V | float | ~1.75 V |
| | $V_S$ | 0 V | $V_e$ | 0 V |

Several semiconductor fabrication processes are known in the industry and may be used to fabricate the memory cells described in accordance with the principles of this invention. A preferred fabrication process is an N-well CMOS process flow with double polysilicon layers and a single metal layer. A modification to this process is necessary to accommodate the third polysilicon layer in the process flow for fabricating memory cells having the structure as in memory cell 40.

Memory cells 30, 40, and 50 described in accordance with this invention cannot be built using the typical self-aligned stacked polysilicon etch process, since the geometries of first polysilicon layer 11 not covered by the geometries of second polysilicon layer 12 will be etched away in such kind of a process. A process with two independent polysilicon etches may be used, which typically yields good characterization data. Two masked N+ implants may be used, one after the first polysilicon mask and another after the second polysilicon mask.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. An electrically erasable and reprogrammable memory device comprising:
   a substrate of a first conductivity type having a substantially planar top surface;
   a channel region portion of said substrate;
   a drain region formed within said substrate and having a second conductivity type opposite said first conductivity type;
   a source region formed within said substrate and having a second conductivity type opposite said first conductivity type, said source region being separated from said drain region by said channel region;
   a dielectric layer formed above said source and drain regions such that the tops of said source and drain regions are substantially even with said top surface of said substrate;
   a control gate formed as a first conductive layer formed above a first part of said channel region which lies adjacent said source region, said control gate being formed overlapping a portion of said source region above said dielectric layer;
   a floating gate formed as a second conductive layer formed above a second part of said channel region not overlapped by said control gate, located between said first part of said channel region and said drain region, and overlapping said control gate; and
   an erase gate formed as a third conductive layer overlapping a portion of said source region above said dielectric layer and not overlapped by said control gate or said floating gate, and a portion of said control gate.

2. A memory device as in claim 1 wherein one or more of said control gate, floating gate, and erase gate, comprise polycrystalline silicon.

3. A memory device as in claim 1 which further comprises programming circuitry for causing the storage of a charge on said floating gate, said programming circuitry applying a control gate voltage to said control gate, a drain voltage to said drain, no voltage to said source region, and no voltage to said erase gate.

4. A memory device as in claim 3 wherein said programming circuitry provides a control gate voltage of approximately 14 volts, a drain voltage within the range of approximately 8 to 10 volts, a source voltage of approximately zero volts and an erase gate voltage of approximately zero volts.

5. A memory device as in claim 1 which further comprises erase circuitry for removing a charge from said floating gate, said erase circuitry serving to provide zero volts to said control gate, drain region, and source region, and an erase voltage to said erase gate.

6. A memory device as in claim 1 which further comprises a bit line formed as a conductive layer contacting said drain region and overlying at least a portion of said first, second, and third conductive layers.

7. A memory device as in claim 6 wherein said bit line overlies at least a portion of one or more of said control gate, said floating gate, and said erase gate.

8. A memory device as in claim 2 wherein said bit line overlies at least a portion of one or both of said control gate and said floating gate.

9. An electrically erasable and reprogrammable memory device as in claim 1 wherein said memory device further comprises circuitry for electrically erasing by applying an erase voltage to said erase gate while electrically grounding said control gate.

10. An electrically erasable and reprogrammable memory device as in claim 9 wherein said memory device further comprises circuitry for programming by applying a programming voltage to said drain while applying a first voltage to said control gate.

* * * * *